(12) United States Patent
Nad et al.

(10) Patent No.: US 11,177,234 B2
(45) Date of Patent: Nov. 16, 2021

(54) PACKAGE ARCHITECTURE WITH IMPROVED VIA DRILL PROCESS AND METHOD FOR FORMING SUCH PACKAGE

(71) Applicant: Intel Corporation, Santa Clara, CA (US)

(72) Inventors: Suddhasattwa Nad, Chandler, AZ (US); Rahul Manepalli, Chandler, AZ (US); Marcel Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 632 days.

(21) Appl. No.: 16/017,393

(22) Filed: Jun. 25, 2018

(65) Prior Publication Data

US 2019/0393183 A1 Dec. 26, 2019

(51) Int. Cl.
*H01L 23/29* (2006.01)
*H01L 23/00* (2006.01)
*H01L 21/48* (2006.01)
*H01L 21/56* (2006.01)
*H01L 23/532* (2006.01)

(52) U.S. Cl.
CPC ............ *H01L 24/33* (2013.01); *H01L 21/486* (2013.01); *H01L 21/563* (2013.01); *H01L 23/293* (2013.01); *H01L 24/11* (2013.01); *H01L 24/17* (2013.01); *H01L 24/27* (2013.01); *H01L 23/5329* (2013.01)

(58) Field of Classification Search
CPC ......... H01L 24/33; H01L 24/11; H01L 24/17; H01L 24/27; H01L 21/486; H01L 21/563; H01L 23/293; H01L 23/5329
USPC ........................................................ 257/678
See application file for complete search history.

(56) References Cited

U.S. PATENT DOCUMENTS 9,496,516 B2 * 11/2016 Sakuma ................... H01L 51/56
2019/0320537 A1 * 10/2019 Nad .......................... G03F 7/165

* cited by examiner

*Primary Examiner* — Tu-Tu V Ho
(74) *Attorney, Agent, or Firm* — Schwabe, Williamson & Wyatt, P.C.

(57) ABSTRACT

Embodiments include a package substrate, a method of forming the package substrate, and a self-assembled monolayers (SAM) layer. The package substrate includes a SAM layer on portions of a conductive pad, where the SAM layer includes light-reflective moieties. The package substrate also includes a via on a surface portion of the conductive pad, and a dielectric on and around the via, the SAM layer, and the conductive pad, where the SAM layer surrounds and contacts a surface of the via. The SAM layer may be an interfacial organic layer. The light-reflective moieties may include a hemicyanine, a cyclic-hemicyanine, an oligothiophene, and/or a conjugated aromatic compound. The SAM layer may include a molecular structure having a first end group of a first monolayer, an intermediate group, a fifth end group of a second monolayer, and one or more of a first and second light-reflective moieties.

25 Claims, 7 Drawing Sheets

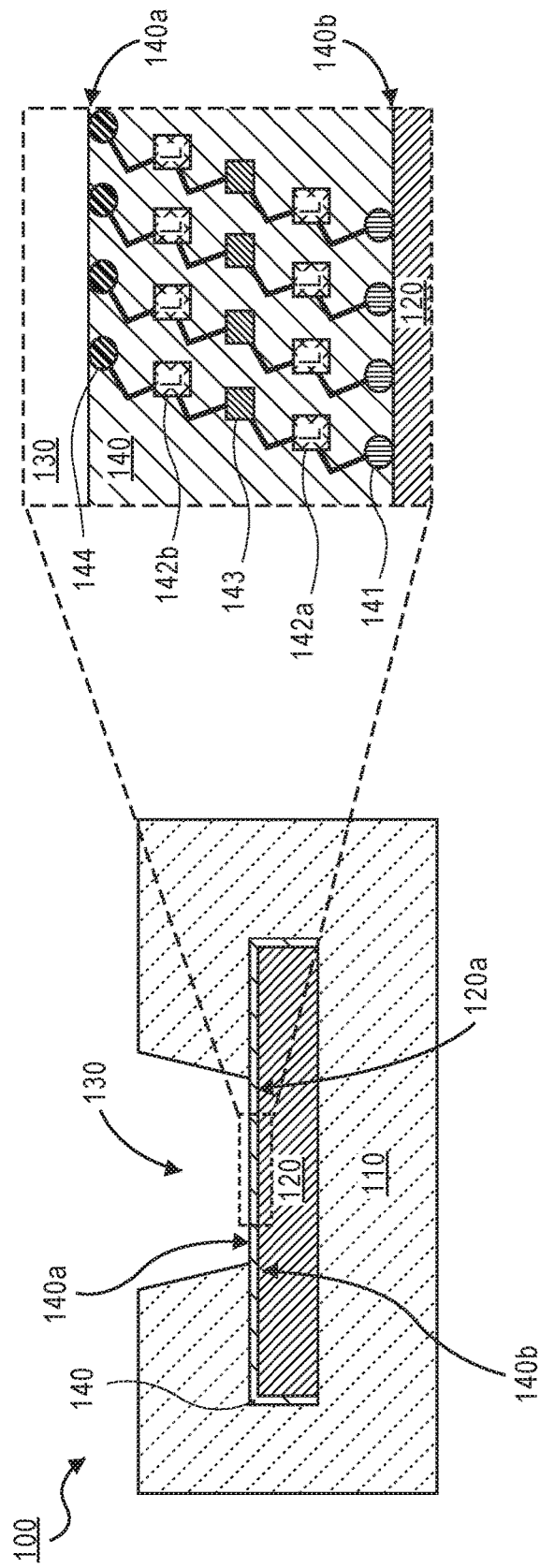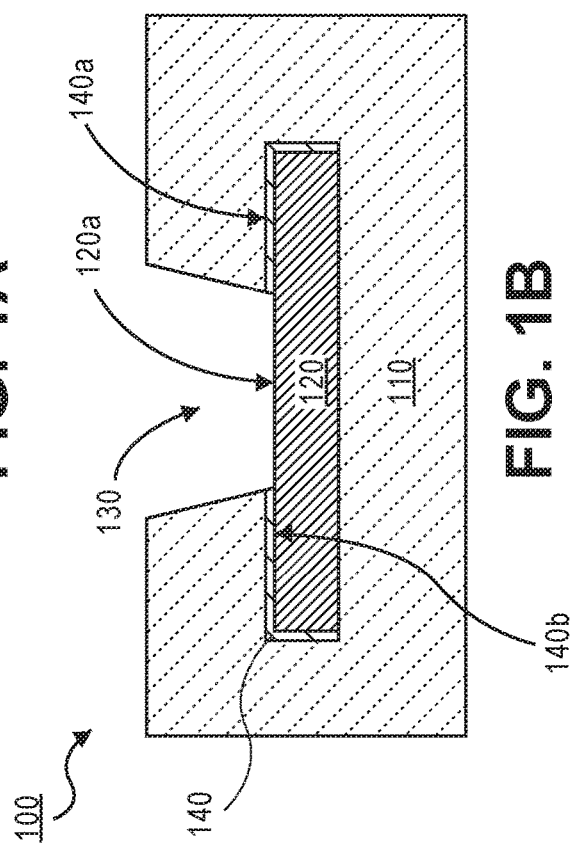
FIG. 1A
FIG. 1B

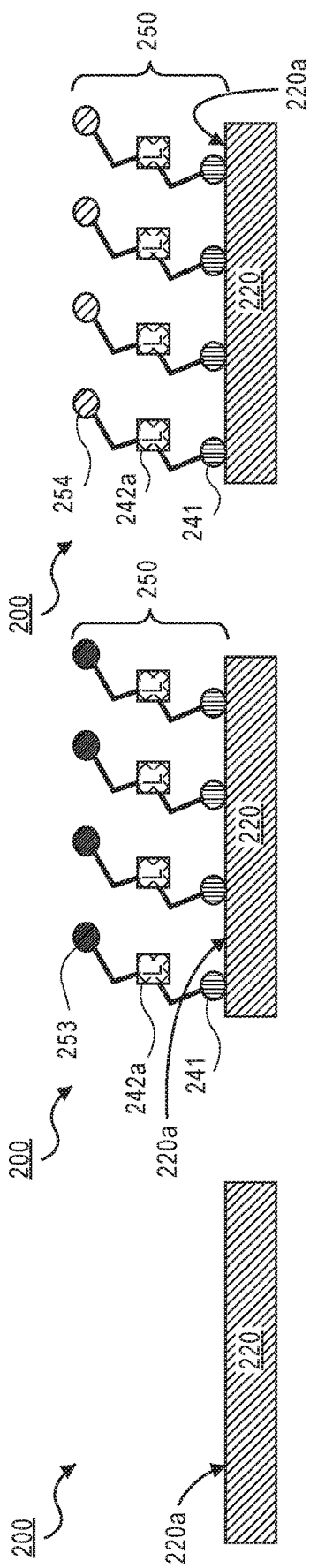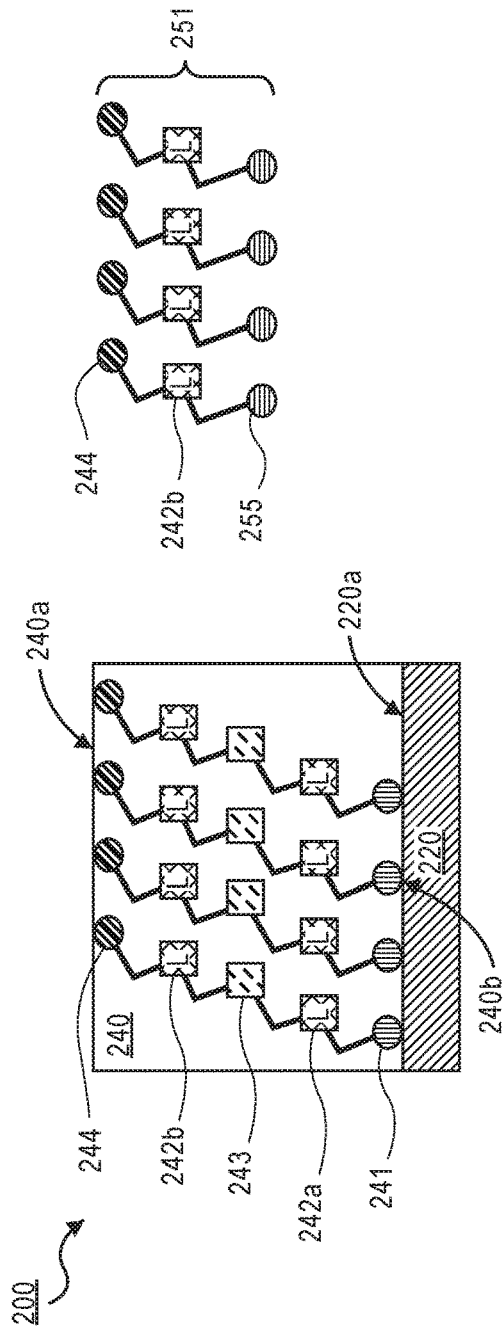

PACKAGE ARCHITECTURE WITH IMPROVED VIA DRILL PROCESS AND METHOD FOR FORMING SUCH PACKAGE

FIELD

Embodiments relate to packaging semiconductor devices. More particularly, the embodiments relate to a package substrate having an organic self-assembled monolayers (SAM) layer with light-reflecting moieties and methods for forming such package substrate.

BACKGROUND

Substrates for next generation chip-to-chip interconnect technologies require significantly higher speed and higher density input/output (IO) routing. Next generation packaging solutions are trending to higher I/O densities to meet the rapidly increasing demand for greater connectivity and faster speeds. To meet this increasing demand, the semiconductor packaging roadmap is pressed to deliver a smaller blind micro vias (BMVs) and a rapidly decreasing fine line spacing (FLS) requirement, for example, from the existing FLS requirement of roughly 9/12 μm towards 2/2 μm or less.

Ultra-violet (UV) lasers are typically used to form such BMVs, while excimer based lasers may be used for next generation packages. Currently, laser-drilled vias are formed using a high energy intense light. The high energy intense light is supplied as pulses or a constant stream to ablate the dielectric surface above/on the metal pad which forms the via openings for the vias. These high energy laser sources, however, not only ablate the dielectric to form the via above the metal, but may also ablate the exposed surface of the metal pad at the bottom of the via. This may lead to several problems including voided vias and/or underfilled vias caused by undercuts (or voids) formed in the metal pad as a result of the lasers' ablation.

For example, as we go towards smaller FLS dimensions and the resultant decrease in the metal thickness, this ablation of the metal surface may create a discontinuous metal landing pad at the bottom of the laser-drilled BMV, such as undercuts in the metal pad that occur below the dielectric. As such, this laser ablation may result in plating defects which may potentially appear as unfilled vias in the final semiconductor package/product. In some additional instances, a non-roughening adhesion promoter (AP) layer may be disposed on the surface of the metal pad to improve the adhesion between the dielectric and the metal pad. This AP layer, however, may also be easily ablated and does not protect the metal pad from high energy laser sources.

As a result, some of the main packaging solutions involve reducing the laser energy and using pulsed laser approaches. These available packaging solutions limit the laser power and thus rely on reducing the incoming energy on to the dielectric and/or the surface of the metal pad. In each of these cases, nonetheless, there are significant challenges with delivering a manufacturable BMV drill process for the next generation FLS semiconductor packages, including increased cost, uncertainty, and complexity. In addition, these packaging solutions reduce the efficacy of the laser drill process by limiting the use of such powerful and accurate lasers used for rapidly creating high resolution BMVs. These limitations not only limit the BMV processing options but also delay the adoption of next generation packaging architectures.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 1A is an illustration of a cross-sectional view of a package substrate having a self-assembled monolayers (SAM) layer with light-reflective moieties, a via opening, a dielectric, and a conductive pad, where the via opening exposes the SAM layer with the light-reflective moieties disposed on the conductive pad, according to one embodiment.

FIG. 1B is an illustration of a cross-sectional view of the respective package substrate after the exposed SAM layer with the light-reflective moieties is removed, according to one embodiment.

FIGS. 2A-2D are illustrations of cross-sectional views of a process flow to form a package substrate having a SAM layer with light-reflective moieties disposed on a top surface of a conductive pad which protects the top surface of the conductive pad from laser ablation, according to some embodiments.

DETAILED DESCRIPTION

Figure 3A:
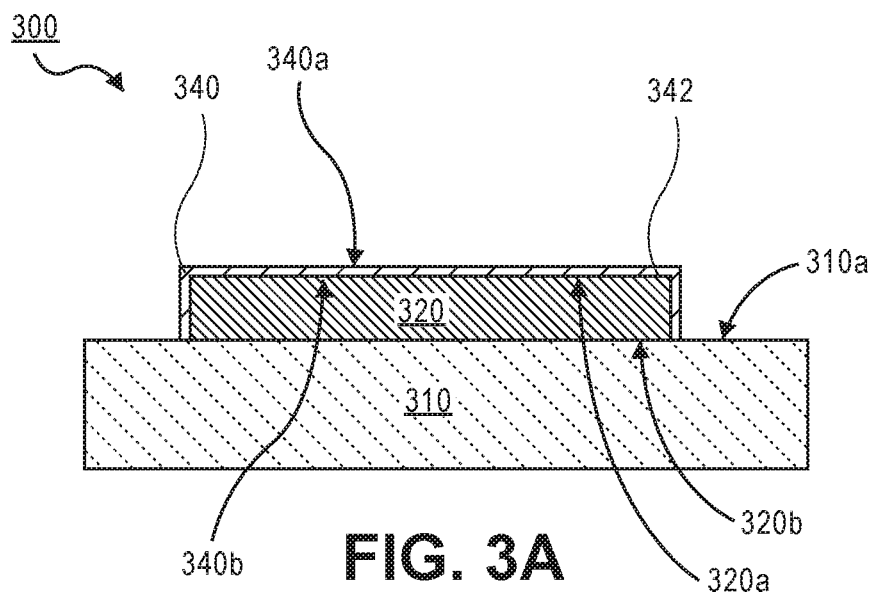
FIGS. 3A-3E are illustrations of cross-sectional views of a process flow to form a package substrate having a SAM layer with light-reflective moieties, a via opening, one or more dielectrics, a conductive pad, and a via, according to some embodiments.

Described herein is an enhanced reflectivity and customizable self-assembled monolayers (SAM) that enables via drilling using ultra-violet (UV)/excimer lasers to create fine line space (FLS) high-density semiconductor package architectures. In particular, a package substrate having a conductive surface (e.g., a thin metal landing pad) coated (or covered) by an organic SAM layer (e.g., an adhesion promoter (AP) SAM (AP-SAM) layer) with light-reflecting moieties is described below and methods for forming such package substrate to improve the surface protection of the conductive surface/pad and to protect the conductive surface/pad from laser ablation.

For some embodiments, the SAM layer may include an AP-SAM layer having light-reflecting moieties and/or any other type of organic layer having light-reflective moieties. For example, the SAM layer may include any interfacial organic layer (or film) that incorporates the light-reflecting chemical moieties described herein. As described in further detail below, these embodiments may dispose the SAM layer on one or more portions of the conductive pad and then create a blind microvia (BMV) on the conductive pad using low-cost high resolution BMV drilling processes. Accordingly, these embodiments advantageously improve the reflection of the impinging low wavelength light of the lasers as the light approaches the surface of the conductive pad, which mitigate/eliminate the impact of laser ablation by incorporating the light-reflecting moieties into the organic SAM layer.

According to some embodiments, a package substrate is described (e.g., the package substrate 100 shown in FIGS. 1A-1B). For one embodiment, the package substrate includes a SAM layer disposed on one or more portions of a conductive pad, where the SAM layer includes a plurality of light-reflective moieties (e.g., as shown with the SAM layer 140 and the conductive pad 120 of FIGS. 1A-1B). In one embodiment, the package substrate also includes a via disposed on a surface of the conductive pad, and a dielectric disposed on and around the via, the SAM layer, and the conductive pad, where the SAM layer surrounds and contacts a surface of the via (e.g., the package substrate 300 shown in FIG. 3E).

In additional embodiments, the SAM layer of the package substrate may include any interfacial organic layer having the plurality of light-reflective moieties (i.e., the SAM layer is not limited to an adhesion promoter (AP) layer, and may include the light-reflecting moieties incorporated/customized into any organic film/laminate). For some embodiments, the package substrate may further include a via pad disposed on the dielectric and a top surface of the via, where the via may have a tapered shape (e.g., the via pad and the via shown in FIG. 3E).

According to some embodiments, the SAM layer of the package substrate may include an AP-SAM layer (e.g., as shown with the detailed view of the SAM layer 140 of FIG. 1A). In these embodiments, the AP-SAM layer may include a first monolayer and a second monolayer, where the first monolayer includes a first end group and at least one of a second end group and a third end group, and wherein the second monolayer includes a fourth end group and a fifth end group (e.g., as shown with the detailed view of the SAM layer 140 of FIG. 1A). According to these embodiments, the first monolayer and the second monolayer include at least one of the plurality of light-reflective moieties and a second plurality of light-reflective moieties (e.g., as shown with the plurality of light-reflective moieties 142a-b of FIG. 1A). In addition, the first end group of the first monolayer may attach to (or contact) the surface of the conductive pad, and the fifth end group of the second monolayer may attach to a surface of the dielectric (e.g., as shown with surfaces 140a-b of FIG. 1A).

As described herein, a "SAM layer" (also referred to as an enhanced reflecting SAM layer, and a light-reflecting SAM layer) refers to an organic layer (or an interfacial organic film) having light-reflecting moieties, which may include an AP-SAM layer with light-reflecting moieties. In addition, the "SAM layer" may also refer to an organic SAM layer having light-reflecting moieties, an organic SAM layer having inorganic moieties, and/or an organic SAM layer having light-reflecting moieties and inorganic moieties. As such, the "SAM layer" described herein refers to any interfacial organic SAM layer (or any organic SAM molecules) incorporated with a light-reflective moiety and attached to any one or more differing surface portions on either face/surface of the organic SAM layer—and is accordingly not limited to an adhesion promoter layer and/or a conductive/metal-dielectric interface.

According to some embodiments, the SAM layer may be incorporated with a light-reflecting moiety to improve (i) the adhesion between two surfaces (e.g., a dielectric surface and a metal surface) and (ii) the surface protection of one or more surfaces (e.g., a metal surface from laser ablation).

Specifically, in some embodiments, a package substrate may include the SAM layer with light-reflecting moieties and reduced/finer BMVs (e.g., the via 361 of FIG. 3E) to meet the demand driving the electronic packaging roadmap to deliver a continually decreasing FLS requirements from the existing 9/12 μm towards 2/2 μm or less, while also enabling the reduced/finer BMVs (and their respective landing pads (e.g., the conductive pad 320 of FIG. 3E)) to be protected from any impinging light source (e.g., an UV/excimer laser) by the SAM layer with light-reflecting moieties reflecting back the excess light source energy and wavelengths.

In some embodiments, the SAM layer may refer to an enhanced reflecting and customizable SAM (ERCSAM) layer and/or an AP-SAM, which may include at least two or more monolayers, and each monolayer may include one or more functional end groups (or desired functional end groups). As described herein, a "monolayer" refers to a layer/film of a given molecule, wherein the layer may be only one molecule thick on a surface structure. As such, as described herein, a "self-assembled monolayer" (SAM) refers to a monolayer formed by a reaction at a surface, where the reaction disposes molecules in the monolayer to line up in a uniform manner (or a customizable manner). For example, the molecules may "self-assemble" as each molecule may form a respective highly selective bond at the surface and position/orientate itself perpendicular to the face of the surface. Note that through such a reaction, a uniform monolayer may be formed. Also note that, in the context of any given monolayer, a molecule (or molecules) of the monolayer described herein refers to those molecules which are each of the majority molecule type in that monolayer.

The package substrate described herein provides several packaging solutions. One of the packaging solutions of the package substrate includes enhancing the adhesion of the dielectric to the non-roughened (or smooth) surface of the conductive pad using the organic SAM layer (e.g., an organic AP-SAM), which eliminates the need for a metal (or copper (Cu)) roughening application. Another packaging solution of the package substrate includes incorporating functional light-reflecting moieties into the constituent molecules of the organic SAM layer (e.g., as shown with the light-reflective moieties 142a-b in the organic layer 140 of FIG. 1A) to protect the surface of the conductive pad during the laser drilling process, and thus eliminate undercuts in the conductive pad to prevent voided/underfilled vias in the package substrate.

Additionally, these embodiments facilitate and improve the emerging field of low-cost high resolution BMV drilling processes used in electronic/semiconductor packaging applications. For example, the embodiments described herein enable such low-cost high resolution BMV drilling processes for high density packages (HDPs) in a wide variety of substrate architectures, including but not limited to fan-out wafer level packages (FOWLPs), embedded wafer level (WL) ball grid array (BGA) (eWLB) packages, among other chip-scale packages (CSPs) and WL-CSP technologies. These embodiments improve such processes and HDPs, for example, by creating SAM layers (i.e., customizing the materials, desirable end grounds, chemical compounds/structural adducts, etc.) that enable final electronic products/packages and manufacturing process flows to have organic layers incorporated with light-reflecting classes of molecules—without interfering with the three-dimensional (3D) stackup of the organic layers. Accordingly, this enables another packaging solution/advantage of the embodiments described herein which allows for improving the light reflecting properties of the organic layers while still retaining the enhanced adhesion promoter properties of the organic layers.

For example, these embodiments enable improved adhesion promoter properties and light-reflecting properties for a smooth surface of the conductive pad by creating, for example, an organic SAM layer disposed in a uniform ordered array of functionalized organic molecules, which are: (i) attached to the smooth surface with a first end group, (ii) available to attach to a dielectric surface with a fifth end group, and (iii) incorporated with active light-reflecting moieties (or functional groups) as part of the backbone of the SAM layer (e.g., incorporated into the first monolayer molecule (M1) and/or the second monolayer molecule (M2)) to improve the reflection of the impinging low wavelength light delivered to the smooth surface of the conductive pad. As a result, a light-reflecting metal and dielectric organic interface layer with enhanced adhesion (also referred to as an ERCSAM layer) can be created to protect the surface of the metal by reflecting back the excess laser energy exposed during the laser drilling process, according to some embodiments.

Other advantages and improvements of the embodiments of the enhanced reflecting SAM layer include: (i) improved metal surface protection from laser ablation; (ii) improved via cleanliness with lower metal debris after laser via drill process; (iii) enabling an emerging field of low-cost high resolution BMV drilling process in electronic packaging applications; (iv) customizing different end groups and light-reflecting moieties; (v) improved adhesion to existing and newly formulated dielectrics to metal layers; (vi) removed from the exposed metal surface area during a rinse/plasma treatment, enabling a pristine organic-free metal surface for next-metal layer fabrication; (vii) implemented with existing and upcoming organic AP chemistry/toolsets, eliminating the need for any specialized toolsets; and (viii) incorporating the light-reflecting moieties into any interfacial organic film.

The technologies described herein may be implemented in one or more electronic devices. For example, an electronic device may include a microelectronic device, a semiconductor die, an integrated circuit (IC), a central processing unit (CPU), a microprocessor, a platform controller hub (PCH), a memory, and a field-programmable gate array (FPGA). Moreover, non-limiting examples of electronic devices that may utilize the technologies described herein may include any kind of wireless device, mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any packaging substrate needing a SAM layer (e.g., an AP-SAM layer) with light-reflective moieties which may be disposed on a conductive pad to protect the conductive pad from laser ablation.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1A is a cross-sectional view of a package substrate 100 having a SAM layer 140 with light-reflective moieties 142a-b, a via opening 130, a dielectric 110, and a conductive pad 120. In one embodiment, the package substrate 100 includes the via opening 130 that exposes the SAM layer 140 with light-reflective moieties 142a-b disposed on the conductive pad 120. In addition, FIG. 1A also illustrates an enlarged and detailed cross-sectional view of the SAM layer 140 with light-reflective moieties 142a-b disposed on a surface 120 (or a top surface, a top surface portion) of the conductive pad 120.

FIG. 1B is a cross-sectional view of the package substrate 100 after the exposed SAM layer 140 in the via opening 130 is removed from above the surface 120a of the conductive pad 120. According to some embodiments, FIGS. 1A-1B illustrate a process flow (or one or more steps of a process flow) that disposes the SAM layer 140 with light-reflective moieties 142a-b on one or more portions of the conductive pad 120 to protect the surface 120a of the conductive pad 120 from laser ablation as a light source (e.g., a laser or the like) is used to pattern the dielectric 110 (or the dielectric layer) to form the via opening 130.

Referring now to FIG. 1A, the package substrate 100 may include the SAM layer 140 disposed on the conductive pad 120. According to some embodiments, the package substrate 100 may include, but is not limited to, a substrate (e.g., one or more conductive/metal layers stacked on each other), a printed circuit board (PCB), and a motherboard. For one embodiment, the package substrate 100 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 100. For one embodiment, the PCB 100 may also include, but not limited to, the dielectric 110, the SAM layer 140, holes, conductive traces/planes, conductive vias/pads (e.g., the via 361 and via pad 360 of FIG. 3E), and conductive pads 120 (or conductive landing pads).

In some embodiments, the SAM layer 140 may include a plurality of light-reflective moieties 142a-b incorporated into the monolayer(s) of the SAM layer 140. In other embodiments, the SAM layer 140 may include at least one of a first plurality of light-reflective moieties 142a and a second plurality of light-reflective moieties (i.e., the SAM layer may include the first plurality of light-reflective moieties and/or the second plurality of light-reflective moieties).

For one embodiment, the SAM layer 140 may be disposed on a top surface 120a and the sidewalls of the conductive pad 120, where a bottom surface of the conductive pad 120 is disposed on a surface of the dielectric 110. According to some embodiments, the top surface 120a of the conductive pad 120 may include the top/outer surface of the sidewall(s) of the conductive pad 120, where the top surface 120a is opposite to the bottom surface of the conductive pad 120. For one embodiment, the conductive pad 120 may be a thin metal (e.g., Cu) landing pad that may include, but is not limited to, Cu, gold (Au), silver (Ag), aluminum (Al), platinum (Pt), nickel (Ni), any combination herein, and/or any combination of one or more other conductive materials. In some embodiments, the top surface 120a of the conductive pad 120 may be a smooth Cu surface (or a non-roughened Cu surface) that, for example, has not been disposed/treated with a chemical treatment.

For some embodiments, the dielectric 110 is disposed on and contacts the top surface 140a SAM layer 140. In one embodiment, the dielectric 110 is disposed on and surrounds the conductive pad 120, where, for example, a bottom surface of the conductive pad 120 is disposed on and contacts a surface (or a surface portion) of the dielectric 110. Note that, in some embodiments, the dielectric 110 may be formed by stacking one or more dielectric layers (e.g., stacking a first build-up film (BF) layer and a second BF layer). For some embodiments, the dielectric 110 may be a polymer material, such as, but not limited to, a dry film resist (DFR), a polyimide, an epoxy, or a BF (e.g., any of various silica particle filled epoxy materials). In additional embodiments, the dielectric 110 may be a polyimide (PI), polytetrafluoroethylene (PTFE), a liquid crystal polymer (LCP), and polyetheretherketone (PEEK).

In some embodiments, the dielectric 110 may also include a laminate material such as FR4, FR5, bismaleimide triazine (BT) resin, or the like. In one embodiment, the dielectric layer 110 may be one layer in a stack that includes a plurality of dielectric layers used to form a build-up structure. As such, the dielectric layer 110 may be formed over another dielectric layer. Additional embodiments may include disposing the dielectric layer 110 as the first dielectric layer over a core material on which the stack is formed.

Figure 3B:
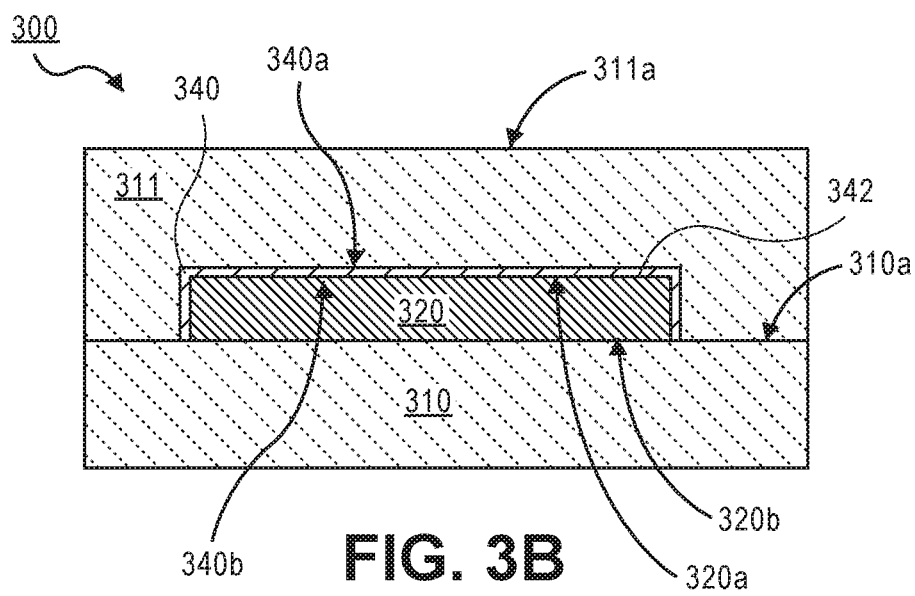
Figure 3C:
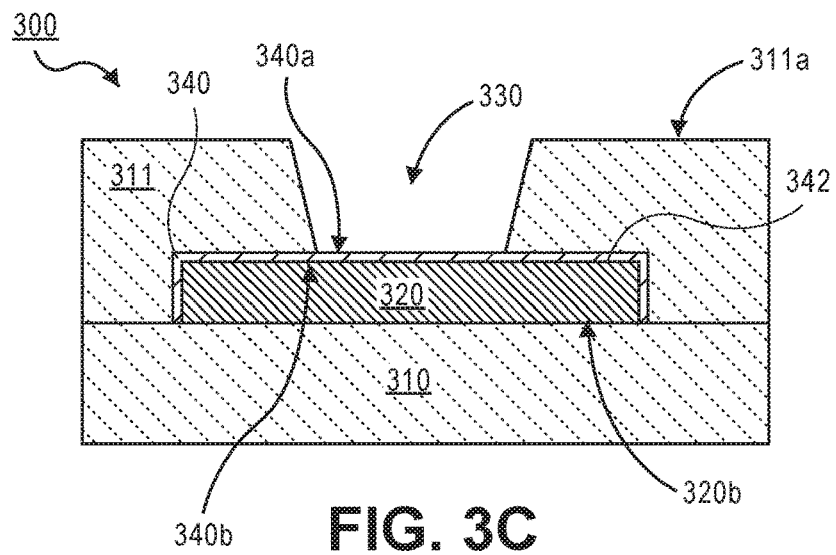
Figure 3D:
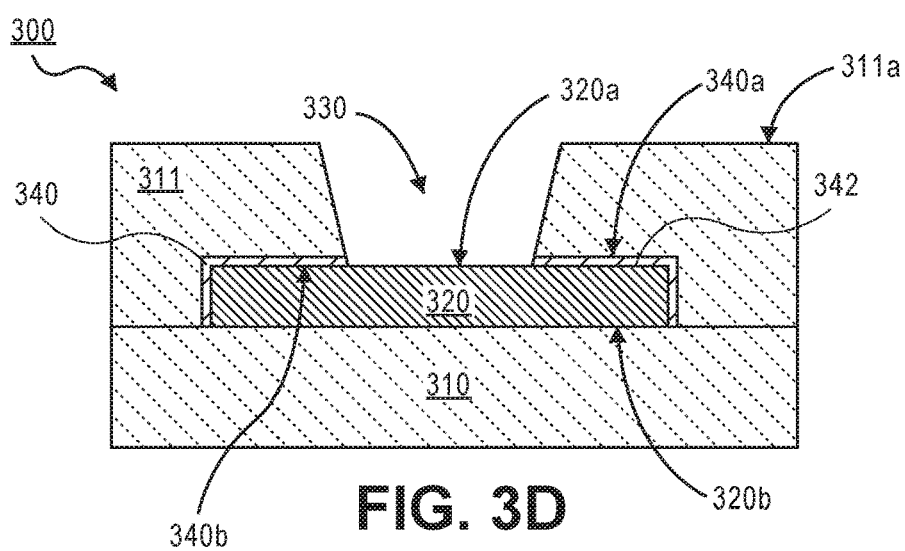
Figure 3E:
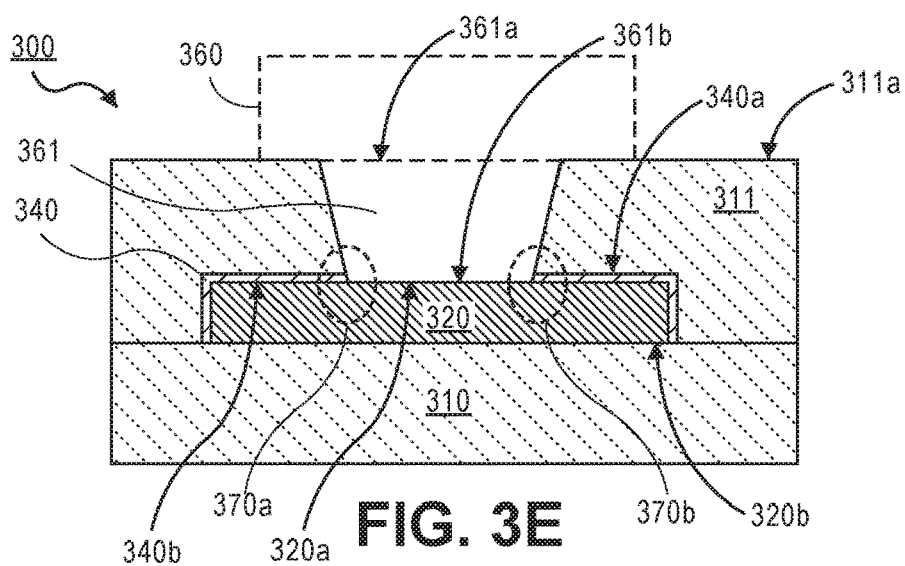

For one embodiment, the dielectric layer 110 is disposed on the SAM layer 140 and the conductive pad 120, where the dielectric layer 110 is then patterned to form the via opening 130 that may provide the opening for the formation of a via (e.g., a BMV) on the top surface 120a of the conductive pad 120 (e.g., as shown with the via 361 of FIG. 3E). In some embodiments, the via opening 130 may be patterned through the dielectric 110 to expose a portion of a top surface 140a (or a top layer) of the SAM layer 140, where a bottom surface 140b (or a bottom layer) of the SAM layer 140 may surround and contact the top surface 120a of the conductive pad 120. In one embodiment, the via opening 130 may have a thickness of approximately 10 µm or less. In another embodiment, the via opening 130 may have a thickness of approximately 25 µm or less.

In one embodiment, the via opening 130 is formed using a laser drilling process such as a high resolution BMV drilling process or the like. In these embodiments, the laser drilling process may deliver a low wavelength light source in pulses or a constant stream onto the dielectric 110 as the dielectric 110 is patterned to form the via opening 130 above the SAM layer 140 and the conductive pad 120. In some instances, the light source ablates through the dielectric to form the via opening, but the light source may also ablate through both the dielectric and the metal pad to form an opening and undercuts in the metal pad. Accordingly, in the embodiments described herein, as the light source ablates through the dielectric 110 and impinges onto the SAM layer 140, the light-reflective moieties 142a-b of the SAM layer 140 enable the light source to be reflected back from the SAM layer 140 to protect the top surface 120a of the conductive pad 120 from, for example, metal undercuts and/or voided vias.

For some embodiments, the SAM layer 140 may be formed with any interfacial organic film/layer which includes the plurality of light-reflective moieties 142a-b. For example, the SAM layer 140 may be an AP-SAM layer or any other organic film/layer incorporated with the light-reflecting moieties 142a-b. In one embodiment, the SAM layer 140 incorporates the light-reflective moieties, and may additionally include, in alternate embodiments, one or more inorganic moieties. In one embodiment, the SAM layer 140 is an AP-SAM having the plurality of light-reflective moieties 142a-b (e.g., as shown with the enlarged, detailed view of the SAM layer 140 of FIG. 1A). For one embodiment, the SAM layer 140 may have a thickness of approximately 1 µm or less.

In some embodiments, as shown in the enlarged, detailed view of the SAM layer 140, the SAM layer 140 may include at least a first monolayer (e.g., the first monolayer 250 of FIG. 2B) and a second monolayer (e.g., the second monolayer 251 of FIG. 2D). For one embodiment, the first monolayer (also referred to as M1) may include a first end group 141 (also referred to as R1) and at least one of a second end group (also referred to as R2) (e.g., the second end group 253 of FIG. 2B) and a third end group (also referred to as R3)) (e.g., the third end group 254 of FIG. 2C), where R2 may be chemically modified (if desired) to form an increased reactive R3 species (i.e., the first monolayer may be assembled as either (R1 and R2) or (R1 and R3) based on the desired packaging design/application). In these embodiments, the first end group 141 may be assembled as a desirable end group that enables improved adhesion between the top surface 120a of the conductive pad 120 and the bottom surface 140b of the SAM layer 140.

For another embodiment, the second monolayer (also referred to as M2) may include a fourth end group (also referred to as R4) (e.g., the fourth end group 255 of FIG. 2D) and a fifth end group 144 (also referred to as R5). In these embodiments, the fifth end group 144 may be assembled as a desirable end group that enables improved adhesion between surfaces (or surface portions) of the dielectric 110 and the top surface 140a of the SAM layer 140. For some embodiments, the second end group (or the third end group) of the first monolayer may react with the fourth end group of the second monolayer to create an intermediate group (or moieties) 143. In these embodiments, the intermediate group 143 (also referred to as X1) may be include a first reactive combination of the second end group R2 and the fourth end group R4, or a second reactive combination of the third end group R3 and the fourth end group R4.

According to some embodiments, the first monolayer and the second monolayer may include a first plurality of light-reflective moieties 142a and/or a second plurality of light-reflective moieties 1420b. For example, the SAM layer 140 may be assembled as a single-point functionalization of the active light-reflecting moiety or a double-point functionalization of the active light-reflecting moiety. In these embodiments, the first and/or second plurality of light-reflective moieties 142a-b are added/incorporated into the SAM layer 140 as part of the backbone(s) of the first and/or second monolayers (M1 and/or M2) to improve the reflection of the impinging low wavelength light (or light source) delivered onto the top surface 120a of the conductive pad 120. Accordingly, the SAM layer 140 having the light-reflective moieties 142a-b may be exposed to a laser via drilling process and thus protect the underlying top surface 120a of the conductive pad 120 by reflecting back the excess laser energy of the laser via drilling process.

According to some embodiments, protecting the conductive surface 120a of the conductive pad 120 from laser ablation may include disposing (or incorporating/integrating) the first and second plurality of light-reflective moieties 142a-b into the molecular backbones of the SAM layer 140. For example, the SAM layer 140 may have a structure of R1-L1-X1-L2-R5 as (i) the functional end groups R1 141 and X1 143 are at opposite ends of the L1 142, and (ii) the functional end groups X1 143 and R5 144 are at opposite ends of L2 242b, where each of the L1 142a and/or the L2 142b may include, but is not limited to, a hemicyanine, a cyclic-hemicyanine, an oligothiophene derivative, and/or another conjugated aromatic compound. For some embodiments, attachments of the L1 142a and the L2 142b to the backbones of the M1 and the M2, respectively, may be implemented as a single-point of attachment (or a single carbon functionalization) or a double-point of attachment (a two carbon atom functionalization). For example, attachments of the L1 142a and the L2 142b to the backbones of the M1 and the M2, respectively, can be made at any of the identified carbon atoms in a hemicyanine (or a cyclic-hemicyanine) structural adduct and/or a suitable derivative of an oligothiophene.

According to some embodiments, the light-reflective moieties 142a-b may include one or more functionalizations of hemicyanines, oligophenes, and/or other conjugated aromatic compounds that are used to achieve/enable light reflection at differing wavelengths. In some embodiments, the light-reflective moieties 142a-b may protect against UV lasers and/or excimer lasers by reflecting back the excess laser energy in the near UV to deep UV range, including, for example, in the wavelength range of approximately 190-380 nm, and with energies from approximately 3.26-6.53 eV (i.e., the molecular properties/structure of the light-reflective moieties 142a-b enable light reflection at these differing wavelengths and energies). In other embodiments, the light-reflective moieties 142a-b may protect against UV lasers and/or excimer lasers by reflecting back the excess laser energy in the near UV to deep UV range including, for example, in the wavelength range of approximately 380 nm or less, and with energies from approximately 3.26 eV or greater.

After the formation of the intermediate group 143 as described above, the molecular structure of the SAM layer 140 may include (i) the first end group 141 coupled (or bonded/extended) to the first plurality of light-reflective moieties 142a, (ii) the first plurality of light-reflective moieties 142a also coupled to the intermediate group 143, (iii) the intermediate group 143 also coupled to the second plurality of light-reflective moieties 142b, and (iv) the second plurality of light-reflective moieties 142b also coupled to the fifth end group 144.

In alternative embodiments, the first monolayer and the second monolayer may include (i) only one of the first plurality of light-reflective moieties 142a or the second plurality of light-reflective moieties 142b, or (ii) both of the first plurality of light-reflective moieties 142a and the second plurality of light-reflective moieties 142b (as shown in FIG. 1A). In an alternate embodiment, based on the example above where only one of the first or second light-reflective moieties 142a-b is included, the SAM layer 140 may be created with the first end group 141 coupled directly to the intermediate group 143 (without having the first light-reflective moieties 142a incorporated therein), or the intermediate group 143 coupled directly to the fifth end group 144 (without having the second light-reflective moieties 142b incorporated therein).

Furthermore, FIG. 1B illustrates the package substrate 100 after the via clean of an exposed portion of the SAM layer 140 that exposes the top surface 120a of the conductive pad 120. In one embodiment, the exposed SAM layer 140 at the bottom of the via opening 130 is removed with an etching process or the like. According to some embodiments, after the BMV laser drilling process is completed, the exposed portion of the SAM layer 140 is removed using the etching process (e.g., an acidic rinse, a plasma treatment, etc.) which enables an organic-free conductive surface 120a for a subsequent conductive/metal layer fabrication (e.g., the fabrication of the via 361 on the organic-free conductive surface 320a as shown in FIG. 3E).

In this embodiment, the package substrate 100 includes the SAM layer 140 disposed on one or more portions of the conductive pad 140 as a portion of the SAM layer 140 has been removed to form a via on the conductive pad 120. In one embodiment, the package substrate 100 may include the SAM layer 140 surrounding and contacting a surface of the via (e.g., as shown in FIG. 3E). In such embodiments, the package substrate 100 may include the via having a tapered shape as such the surface edge(s) of the SAM layer 140 surrounding and contacting the surface of the via may also have a tapered shape. Additionally, the SAM layer 140 may respectively surround and contact the bottom surface of the via.

Note that a SAM layer described herein may include any organic layer (or any organic molecules) incorporated with a light-reflective moiety and may be attached to any surface portion—and is accordingly not limited to an adhesion promoter layer and/or a metal-dielectric interface. Also note that the package substrate 100 of FIGS. 1A-1B may include fewer or additional packaging components based on the desired packaging design.

FIGS. 2A-2D are cross-sectional views of a process flow 200 to form a package substrate having a SAM layer 240 with light-reflective moieties 242a-b disposed on a top surface 220a of a conductive pad 220 which protects the top surface 220a of the conductive pad 220 from laser ablation, according to some embodiments. These embodiments as shown with respect to FIGS. 2A-2D provide the process flow 200 that bonds a first monolayer 250 and a second monolayer 251, for example, in a two-step SAM which creates the SAM layer 240 having the light-reflective moieties 242a-b (e.g., the SAM layer 240 as shown in FIG. 2D).

In addition, as shown with respect to FIGS. 2A-2D, these embodiments of the process flow 200 enable protecting the surface 220a of the conductive pad 220 during a via laser drilling process by incorporating light-reflecting moieties 242a-b into the SAM layer 240 to create an ordered array of non-stacking self-assembled light reflecting organic monolayer. The process flow 200 may also illustrate the plurality of light-reflecting moieties 242a-b (or light-reflecting functional groups) incorporated into the SAM layer 240 as part of the backbone of the first and second monolayers 250-251, which improves the reflection of any low wavelength light impinged on the conductive surface 220a of the conductive pad 220. For some embodiments, the process flow 220 may utilize two bi-functional molecules with disparate end functionalities to create the SAM layer 240 as a single SAM having a first surface 240b on the conductive surface 220a, and a second surface 240a presenting a desirable functional group for a dielectric polymer surface interface or any other surface interface.

One such embodiment is illustrated and described based on FIGS. 2A-2D, which illustrates cross-sectional views of the creation of the SAM layer 240 disposed on the conductive pad 220. For one embodiment, the conductive pad 220, the SAM layer 240, and the light-reflective moieties 242a-b of the package substrate shown in FIGS. 2A-2D may be similar to the conductive pad 120, the SAM layer 140, and the light-reflective moieties 142a-b of the package substrate 100 of FIGS. 1A-1B. In the illustrated embodiments, the process flow of forming the SAM layer 240 is shown, however it is to be appreciated that the illustrated features are not limiting and may be formed using different processing operations, different molecular structures, and/or additional molecules (or monolayers). Note that well-known features of FIGS. 2A-2D are omitted or simplified in order not to obscure the illustrative implementations.

Referring now to FIG. 2A, the process flow 200 illustrates a conductive pad 220 having a top surface 220a. In one embodiment, the conductive pad 220 may be a thin metal pad (or a thin metal trace) having a thickness of approximately 20 μm or less. The conductive pad 220 may be used as a landing conductive pad (or a landing conductive layer) for a subsequent via formation.

FIG. 2B illustrates the process flow 200 disposing a first monolayer 250 (also referred to as M1) on the conductive pad 220, according to one embodiment. In one embodiment, the process flow 200 disposes the first monolayer 250 on the top surface 220a of the conductive pad 220 using, for example, a dip process or the like. The first monolayer 250 may include non-interacting functional end groups such as a first end group 241 (also referred to as R1) and a second end group 253 (also referred to as R2). In one embodiment, the first monolayer 250 may be disposed on the top surface 220a of the conductive pad 220 as the first end group 241 and the second end group 253 are non-interacting end groups that may not react with each other. The first monolayer 250 may also include a first plurality of light-reflective moieties 242a (also referred to as L1) incorporated in between the first end group 241 and the second end group 253. In some embodiments, the first plurality of light-reflective moieties 242a may be active light reflecting moieties formed as a part of the structural backbone of the first monolayer 250.

In some embodiments, the first end group 241 may provide a desirable end group that attaches to the top surface 220a of the conductive pad 220. For example, the first end group 241 of the first monolayer 250 is used to create a SAM layer that surrounds and contacts the top conductive surface 220a of the conductive pad 220. The first end group 241 may attach to the conductive surface 220a to deliver an ordered array of self-assembled molecules that may present the second end group 253 for further treatment.

According to one embodiment, protecting the conductive surface 220a from laser ablation may initially include disposing the first monolayer 250 on the conductive surface 220a. For example, the first monolayer 250 may have a structure of R1-L1-R2, where the functional end groups R1 241 and R2 253 are at opposite ends of L1 242a that, for example, includes a hemicyanine, a cyclic-hemicyanine, an oligothiophene derivative, and/or another conjugated aromatic compound. For some embodiments, attachment of the L1 242a to the backbone of M1 250 (and/or the L2 242b to the M2 251 as described below) may be implemented as a single-point of attachment (or a single carbon functionalization) or a double-point of attachment (a two carbon atom functionalization). For example, attachment of the L1 242a to the backbone of M1 250 can made at any of the identified carbon atoms in a hemicyanine (or a cyclic-hemicyanine) structural adduct and/or a suitable derivative of an oligothiophene.

According to some embodiments, the light-reflective moieties 242a may include one or more functionalizations of hemicyanines, oligophenes, and other conjugated aromatic compounds that are used to achieve/enable light reflection at differing wavelengths. In some embodiments, the light-reflective moieties 242a may protect against UV lasers and/or excimer lasers by reflecting back the excess laser energy in the near UV to deep UV range, including, for example, in the wavelength range of approximately 190-380 nm, and with energies from approximately 3.26-6.53 eV (i.e., the molecular properties/structure of the light-reflective moieties 242a enable light reflection at these differing wavelengths and energies). In other embodiments, the light-reflective moieties 242a may protect against UV lasers and/or excimer lasers by reflecting back the excess laser energy in the near UV to deep UV range including, for example, in the wavelength range of approximately 380 nm or less, and with energies from approximately 3.26 eV or greater.

For one embodiment, functional end group R2 253 may be substantially non-reactive with functional end group R1 241. Such non-reactivity between R1 241 and R2 253 may mitigate self-polymerization of the M1 250, thus facilitating formation of a monolayer of M1 molecules. As described herein, at least in the context of two given functional groups, "substantially non-reactive" refers to, at least at standard temperature and pressure, one functional group may not bond with or otherwise chemically react with the other functional group. In some embodiments, R2 253 is also substantially non-reactive with a conductor (or non-reactive with a dielectric) of the conductive surface 220a to which R1 241 is bonded. In one embodiment, R2 243 may include, but is not limited to, any of a variety of acids, acid anhydrides, aliphatic alcohols, aromatic alcohols, or unsaturated hydrocarbons.

FIG. 2C illustrates an optional step of the process flow 200 chemically modifying the second end group 253 (R2) into a third end group 254 (also referred to as R3). Although some embodiments are not limited in this instance, the first monolayer 250 may be chemical modified into R1 241 and R3 254 molecules—e.g., prior to bonding of the first surface portion with a second surface portion such as a dielectric surface. In these embodiments, the R2 253 molecules may be modified by a chemical process (e.g., including acylation and/or esterification) to form another functional group R3 254 in place of the earlier R2 253 functional end group.

In some embodiments, the third end group 254 may be formed using known chemical treatments (or the like), where R2 253 undergoes a functionalization change into an increased reactive R3 254 species. Accordingly, based on this optional step of the process flow 200, the first monolayer 250 (M1) may be assembled to include (i) the end groups R1 241 and R2 253 or (ii) the end groups R1 241 and R3 254 based on the desired packaging design/application.

In these optional embodiments, the R3 254 may include a group resulting from acylation or esterification of an acid anhydride, a thioanhydride, or an amide. Accordingly, as described below in FIG. 2D, a fourth end group 255 (R4) may be reactive with R2 253 and/or any functional group R3 254 which may be produced from R2 253 prior to the bonding reaction with a second monolayer molecule. For example, the R4 255 may include, or be a derivative of, any of a variety of amines, thiols, disulfides, acid anhydrides, or alcohols.

FIG. 2D illustrates the process flow 200 disposing a second monolayer 251 (also referred to as M2) on/above the first monolayer 250 to create the SAM layer 240, according to one embodiment. In one embodiment, the process flow 200 disposes the second monolayer 251 on a surface of the first monolayer 250 using, for example, a dip process or the like which may require heating. In this second step of the SAM to create the SAM layer 240, the second monolayer 251 is disposed on the surface of the first monolayer 250 which then reacts with R2 253 (or the R3 254) to bond/extend the SAM ending in a desirable functional group presented to a second surface/interface (e.g., a dielectric surface), according to some embodiments.

The second monolayer 251 may include non-interacting functional end groups such as a fourth end group 255 (also referred to as R4) and a fifth end group 244 (also referred to as R5). In one embodiment, the second monolayer 251 may be disposed on the surface of the first monolayer 250 as (i) the fourth end group 255 and the fifth end group 244 are non-interacting end groups that may be substantially non-reactive with each other, and (ii) likewise the fifth end group 244 and the second end group 253 (or the third end group 254) are non-interacting end groups that may be substantially non-reactive with each other. For some embodiments, in this second step of the SAM, the R4 255 of the M2 251 may react with the R2 253 (or the R3 254) of the M1 250 to create an intermediate group (or moieties) 243 (also referred to as X1). In these embodiments, the intermediate group 243 may be include a first reactive combination of the R2 253 and the R4 255, or a second reactive combination of the R3 354 and the R4 255. In addition, the second monolayer 251 may also include a second plurality of light-reflective moieties 242b (also referred to as L2) incorporated in between the fourth end group 255 and the fifth end group 244. In some embodiments, the first plurality of light-reflective moieties 242a may be active light reflecting moieties formed as a part of the structural backbone of the second monolayer 251.

In one embodiment, the second monolayer 251 may now present the R5 244 moieties at a top surface 240a of the SAM layer 240 for attachment to a second surface/interface (e.g., a dielectric) using, for example, a vacuum lamination, a spin on coating process, or the like. Accordingly, the SAM layer 240 may be created as a SAM by the reactive bonding of the first and second monolayers 250-251. The SAM layer 240 may include a uniform ordered array of functionalized organic molecules (e.g., a uniform ordered array of organic molecules depicted as R1-L1-X1-L2-R5), where a bottom surface 240b of the SAM layer 240 may be attached to the conductive surface 220a with the first end group 241, and a top surface 240a of the SAM layer 240 may be attached to a second surface (e.g., a dielectric surface) with the fifth end group 244.

In some embodiments, the fifth end group 244 may provide a desirable end group (e.g., including improved adhesion with a dielectric material) that attaches to a surface of a second layer/material (e.g., the surface of the dielectric 110 as shown in FIGS. 1A-B). According to one embodiment, protecting the conductive surface 220a from laser ablation may further include disposing the second monolayer 251 on/above the first monolayer 250 and the conductive surface 220a. For example, the second monolayer 251 (M2) may have a structure of R4-L2-R5, where the functional end groups R4 255 and R5 244 are at opposite ends of L2 242b that, for example, includes a hemicyanine, a cyclic-hemicyanine, an oligothiophene derivative, and/or another conjugated aromatic compound. For some embodiments, attachment of the L2 242b to the backbone of M2 251 may be implemented as a single-point of attachment (or a single carbon functionalization) or a double-point of attachment (a two carbon atom functionalization). For example, attachment of the L2 242b to the backbone of M2 251 can made at any of the identified carbon atoms in a hemicyanine (or a cyclic-hemicyanine) structural adduct and/or a suitable derivative of an oligothiophene.

According to some embodiments, the light-reflective moieties 242b may include one or more functionalizations of hemicyanines, oligophenes, and/or other conjugated aromatic compounds that are used to achieve/enable light reflection at differing wavelengths. In some embodiments, the light-reflective moieties 242b may protect against UV lasers and/or excimer lasers by reflecting back the excess laser energy in the near UV to deep UV range, including, for example, in the wavelength range of approximately 190-380 nm, and with energies from approximately 3.26-6.53 eV (i.e., the molecular properties/structure of the light-reflective moieties 242b enable light reflection at these differing wavelengths and energies). In other embodiments, the light-reflective moieties 242b may protect against UV lasers and/or excimer lasers by reflecting back the excess laser energy in the near UV to deep UV range including, for example, in the wavelength range of approximately 380 nm or less, and with energies from approximately 3.26 eV or greater.

In alternative embodiments, the SAM layer 240 may include only one of the first plurality of light-reflective moieties 242a or the second plurality of light-reflective moieties 2420b. In these alternate embodiments, the SAM layer 240 may be created with the first end group 241 coupled directly to the intermediate group 243 (without having the first light-reflective moieties 242a incorporated therein), or the intermediate group 243 coupled directly to the fifth end group 244 (without having the second light-reflective moieties 142b incorporated therein). For example, the SAM layer 240 may be assembled having (i) the first monolayer 250 not incorporated with any light-reflective moieties and the second monolayer 251 incorporated with the second plurality of light-reflective moieties 242b (i.e., the SAM layer 240 having the structure R1-X1-L2-R5), or (ii) the first monolayer 250 incorporated with the first plurality of light-reflective moieties 242a and the second monolayer 251 not incorporated with any light-reflective moieties (i.e., the SAM layer 240 having the structure R1-L1-X1-R5).

In some embodiments, the R1 241 may include, or be a derivative of, any of a variety of thiols, disulfides, amines, azoles, amides, imides, pyridine derivatives, cyanoacrylate derivatives, and/or other moieties which include a sulfur atom or a nitrogen atom, where, for example, the R1 241 may enable a strong covalent bond with a conductive/metal surface. Likewise, in additional embodiments, the R5 244 may include, or be a derivative of, any of a variety of amines, azoles, imides, and/or cyanoacrylate derivatives, where, for example, the R5 244 may enable a strong covalent bond with a dielectric polymer. In some embodiments, bonding or other adhering of a functional group with a surface may be implemented with chemisorption, physisorption, and/or the like.

Although some embodiments are not limited in this instance, a reaction to form the SAM layer 240 from the second monolayer 251 and the first monolayer 250 may include an addition reaction between the M2 251 and the M1 250. As described herein, an "addition reaction" refers to a reaction between two molecules which combine to form, as a single reaction product (or the adduct), a larger molecule which includes all atoms of the two molecules—where the reaction does not further produce any other by-product. In using a reaction between two monolayers, some embodiments may variously provide for very strong bonding that, for example, may be tailored to a particular combination of material layers which are to be joined together.

For some embodiments, attaching the top surface 240a and the bottom surface 240b of the SAM layer 240 may be performed according to any of a variety of techniques which, for example, are adapted from conventional self-assembling chemistry techniques. For example, such techniques may include, but are not limited to, dip-coating, spray coating, atomic layer deposition, chemical vapor deposition, and/or the like.

An end group of a SAM molecule may include any of a variety of groups to facilitate reaction which attaches the SAM molecule to a surface such as that of a dielectric material (e.g., the dielectric 110 of FIGS. 1A-1B) or a metallization structure (e.g., the conductive pad 120 of FIGS. 1A-1B). SAM molecules may adhere to such a surface through chemisorption, physisorption, and/or the like. The R1 head group of the M1 may include any of a variety of functional groups comprising at least one sulfur atom or at least one nitrogen atom. For example, such a chemistry of the R1 group may promote chemisorption or other attachment of the M1 molecule on the conductive surface (e.g., a copper surface). In one embodiment, the functional group R1 may include, or be a derivative of, any of a variety of disulfide groups of the form (S—S—Ra), where Ra is a hydrogen atom or an organic component of the R1. In an alternate embodiment, the R1 may include a thiol.

In some embodiments, the functional group R1 includes or is a derivative of an amine group such as any of a variety of primary, secondary, tertiary, and/or cyclic amines. Some examples of such an R1 group include various derivatives of aniline and 2-aminopentane. The functional group R1 may alternatively include, or be a derivative of, an azo group or any of a variety of azole groups such as imidazole, pyrazole, triazole, and/or tertrazole. For example, the R1 may include cyclic ring comprising a carbon atom, where the M1 may include a substituted imidazole. In other embodiments, the R1 may include a pyridine derivative. The functional group R1 may alternatively include or be a derivative of an amide such as any of a variety of organic amide groups. In some embodiments, the R1 may include any of a variety of cyanoacrylate derivatives. For example, the M1 may include a derivative of 2-octylcyanoacrylate or isobutyl cynoacrylate.

In some embodiments, the functional group R2 may include, or be a derivative of, an acid such as any of a variety of organic acids which, for example, include a carboxyl (COOH) group. The functional group R2 may alternatively include, or be a derivative of, an acid anhydride such as any of a variety of organic acid anhydrides. In other embodiments, the functional group R2 may include, or be a derivative of, any of a variety of thioanhydrides such as benzoic thioanhydride. The functional group R2 may alternatively include, or be a derivative of, an aliphatic alcohol such as any of a variety of organic aliphatic alcohols. In additional embodiments, the functional group R2 may include, or be a derivative of, an aromatic alcohol such as any of a variety of organic aromatic alcohols. The functional group R2 may alternatively include, or be a derivative of, an unsaturated hydrocarbon such as any of a variety of aliphatic or aromatic chain molecules which, for example, include an alkenyl moiety (e.g., a vinyl group) or an alkyne moiety.

The R1 and R2 of the M1 molecule may be substantially non-reactive with each other, thereby mitigating self-polymerization and 3-D stackups. In one embodiment, an R1-R2 functional group combination of a M1 molecule includes a thiol of R1 and an organic alcohol of R2, where, for example, a structure R1-L1-R2 of the M1 molecule is HS-L1-OH. In some embodiments, the excess M1 molecules may be washed away prior to the introduction of an M2 molecule, thereby further reducing the chance of 3-D stackups.

The M1 molecule may include an end group R2 at least upon attachment to a conductive structure (e.g., the conductive pad 220). Although some embodiments are not limited in this instance, the end group R2 may be subsequently reacted to produce a modified end group R3, where, for example, such reaction occurs prior to reaction with a M2 molecule. The functional group R3 may include a product of such reaction involving R2, where, for example, the reaction results in acylation, esterification, or amide bond formation to remove, replace, or otherwise modify at least some of the end group R2. For example, the R2 may include or be a derivative of, an alcohol, an acid, and/or an acid anhydride, where the R3 results from an esterification of the R2. In some embodiments, the reaction to form the R3 chemically modifies an acid anhydride and/or a thioanhydride of the R2.

Referring now to the M2 molecule, in some embodiments, the end group R4 may include, or be a derivative of, an amine such as any of those described herein with reference to R1. In alternative embodiments, the R4 may include a thiol. In some embodiments, the R4 may include, or is a derivative of, a disulfide such as any of those described herein with reference to the R1. The functional group R4 may alternatively include, or be a derivative of, an acid anhydride and/or an alcohol such as any of those described herein with reference to the R2. In addition, the head group R5 of the M2 may include, or be a derivative of, an amine, an azole, and/or an imide such as any of those described herein with reference to the R1. In some embodiments, the R5 includes a cyanoacrylate derivative such as any of those described herein with reference to the R1. Since the R1 and the R5 are separated into two different molecules, polymerization may be mitigated, enabling the use of more reactive attachment pathways including, for example, a thiol. Additionally, the M1 and/or the M2 may only have one or more (e.g., only two) functional groups which are reactive, thereby allowing a wider variety and/or higher reactivity of end group combinations R2 and R4 (or R3 and R4). In some embodiments, the R4 and the R5 are substantially non-reactive with each other. For example, the R4 and the R5 may each include a respective amine (e.g., NH2), a respective carboxyl group (e.g., COOH), a respective alcohol group (e.g., OH), and/or other such group which is not reactive with its own group type.

Note that, after the illustrated/described process flow step of FIG. 2D, the SAM layer 240 may thus provide the R5 244 moieties at the surface 240a for attachment to a subsequent surface (e.g., the surface of the second dielectric lamination/coating as shown in FIG. 3B) during a vacuum lamination/coating step. Also note that the SAM layer 240 of the package substrate formed by the process flow 200 of FIGS. 2A-2D may include fewer or additional packaging components based on the desired packaging design.

FIGS. 3A-3E are cross-sectional views of a process flow to form a package substrate 300 having a SAM layer 340 with light-reflective moieties 342, a via opening 330, a first dielectric 310, a second dielectric 311, a conductive pad 320, and a via 361, according to some embodiments. For one embodiment, the process flow of FIGS. 3A-3E may be similar to a process flow 500 described below in FIG. 5. In some embodiments, the process flow of FIGS. 3A-3E illustrates forming the package substrate 300 having the SAM layer 340 with light-reflective moieties 342 disposed on a surface 320a of the conductive pad 320, where the SAM layer 340 with light-reflective moieties 342 protect the surface 320a of the conductive pad 320 from subsequent laser ablation by a via laser drilling process (e.g., a UV laser, an excimer laser, etc.).

One such embodiment is illustrated and described based on FIGS. 3A-3E, which illustrates cross-sectional views of forming the package substrate 300 having the SAM layer 340 with light-reflective moieties 342 disposed on one or more surface portions of the conductive pad 320. For one embodiment, the conductive pad 320, the SAM layer 340, and the light-reflective moieties 342 of the package substrate 300 shown in FIGS. 3A-3E may be similar to the conductive pad 120, the SAM layer 140, and the light-reflective moieties 142a-b of the package substrate 100 of FIGS. 1A-1B. In another embodiment, the conductive pad 320, the SAM layer 340, and the light-reflective moieties 342 of the package substrate 300 shown in FIGS. 3A-3E may be similar to the conductive pad 220, the SAM layer 240, and the light-reflective moieties 242a-b of the package substrate of FIGS. 2A-2D. In the illustrated embodiments, the process flow of forming the package substrate 300 the SAM layer 340 with the light-reflective moieties 342 is shown, however it is to be appreciated that the illustrated features are not limiting and may be formed using different processing operations. Note that well-known features of FIGS. 3A-3E are omitted or simplified in order not to obscure the illustrative implementations.

Referring back to FIG. 3A, the package substrate 300 disposes the SAM layer 340 on the surface 320a on the conductive pad 320. In one embodiment, a bottom surface 320b of the conductive pad 320 is disposed on a surface 310 of a first dielectric 310 (e.g., an underlying BF layer). Additionally, the SAM layer 340 may include the light-reflective moieties 342. For one embodiment, the SAM layer 340 may include a bottom surface 340b surrounding and contacting the surface 320a of the conductive pad 320, and a top surface 340a exposed and available to attach to a subsequent surface (e.g., the surface of the second dielectric 310 as shown in FIG. 3B).

FIG. 3B illustrates the package substrate 300 disposing/laminating a second dielectric 311 on the SAM layer 340 and the first dielectric 310. In some embodiments, the second dielectric 311 may be a second BF layer disposed on the surface 340a of the SAM layer 340 and the surface 310a of the first dielectric 310. For some embodiments, the second dielectric 311 may be similar to the first dielectric 310. The second dielectric 311 may include a surface 311a formed above the SAM layer 340 and the conductive pad 320.

FIG. 3C illustrates the package substrate 300 patterning the second dielectric 311 using a light source to form a via opening 330 that exposes the SAM layer 340. In one embodiment, the light source may be delivered by, for example, an UV laser and/or an excimer laser (or the like) onto the dielectric surface 311a to form the via opening 330. For one embodiment, the via opening 330 may be formed through the second dielectric 311 to expose a portion of the SAM layer 340, where the exposed portion of the SAM layer 340 reflects the light source from impinging a surface portion (i.e., a surface portion of the surface 320a) of the conductive pad 320. In some embodiments, the light-reflective moieties 342 of the SAM layer 340 may protect the surface portion of the conductive pad 320 from the impinging light source by reflecting back the excess light source energy and wavelengths.

FIG. 3D illustrates the package substrate 300 removing the exposed SAM layer 340 to expose the surface portion of the conductive pad 320. In one embodiment, the exposed SAM layer 340 at the bottom of the via opening 330 is removed with an etching process or the like. According to some embodiments, after the via laser drilling process is implemented, the exposed portion of the SAM layer 340 is removed using the etching process (e.g., an acidic rinse, a plasma treatment, etc.) to expose the surface portion (i.e., an organic-free surface portion) of the surface 320a of the conductive pad 320. In one embodiment, the exposed surface portion of the conductive pad 320 may be used for a subsequent conductive layer fabrication as shown below in FIG. 3E.

FIG. 3E illustrates the package substrate 300 disposing (or depositing) a conductive material into the via opening 330 to form a via 361 on the exposed surface portion of the conductive pad 320. In one embodiment, the conductive material may be similar to the conductive material (e.g., Cu) used to form the conductive pad 320. For one embodiment, the via 361 has a bottom surface 361b coupling/contacting the top surface 320a of the conductive pad 320. For some embodiments, the bottom surface 361b of the via 361 may have a flat, organic-free conductive (or Cu) grain boundary, for example, as a result of the SAM layer 340 protecting the surface 320a of the conductive pad 320 (i.e., laser ablation may form a curved conductive (Cu) grain boundary caused by undercutting a conductive pad surface). In one embodiment, the via 361 may be a laser-plated via formed with any convention process, including, for example, a BMV laser drilling process used to form the via opening 330—which is subsequently plated with an electroless plating process (or the like) to form the via 361.

For one embodiment, the package substrate 300 may then include the SAM layer 340 disposed on one or more portions of the conductive pad 340 as the earlier exposed surface portion of the SAM layer 340 is removed to conductively couple the via 361 on the surface 320a of the conductive pad 320. In some embodiments, as depicted with portions 370a-

*b*, the SAM layer 340 may surround and contact a surface(s) of the via 361, where, for example, the SAM layer 340 may be embedded (or sandwiched) in between the dielectric 311 above, the conductive pad 320 below, and the via 361 adjacently. For example, the SAM layer 340 may be surrounding and contacting the bottom surface/layer 361*b* of the via 361. In some embodiments, the package substrate 300 may include the via 361 having a tapered shape as such the surface edge(s) (as depicted with 370*a-b*) of the SAM layer 340 that is surrounding and contacting the surface of the via 361 may also have a tapered shape.

In additional embodiments, the package substrate 300 may dispose the conductive material into the via opening 330 to form the via 361 and the via pad 360. For example, the via pad 361 may be disposed on the surface 311*a* of the second dielectric 311 and a top surface 361*a* of the via 361. For alternative/additional embodiments, the package substrate 300 may dispose (or stack) a second via directly on the top surface 361*a* of the via 361 as the second via may be formed similarly to the via 361, where, for example, a second SAM layer with light-reflective moieties (as described herein) may be disposed on the dielectric surface 311*a* and/or the top surface 361*a* of the via 361 to protect the via 361 from any subsequent laser ablation used to form the second via.

Note that the package substrate 300 of FIGS. 3A-3E may include fewer or additional packaging components based on the desired packaging design.

Figure 4:
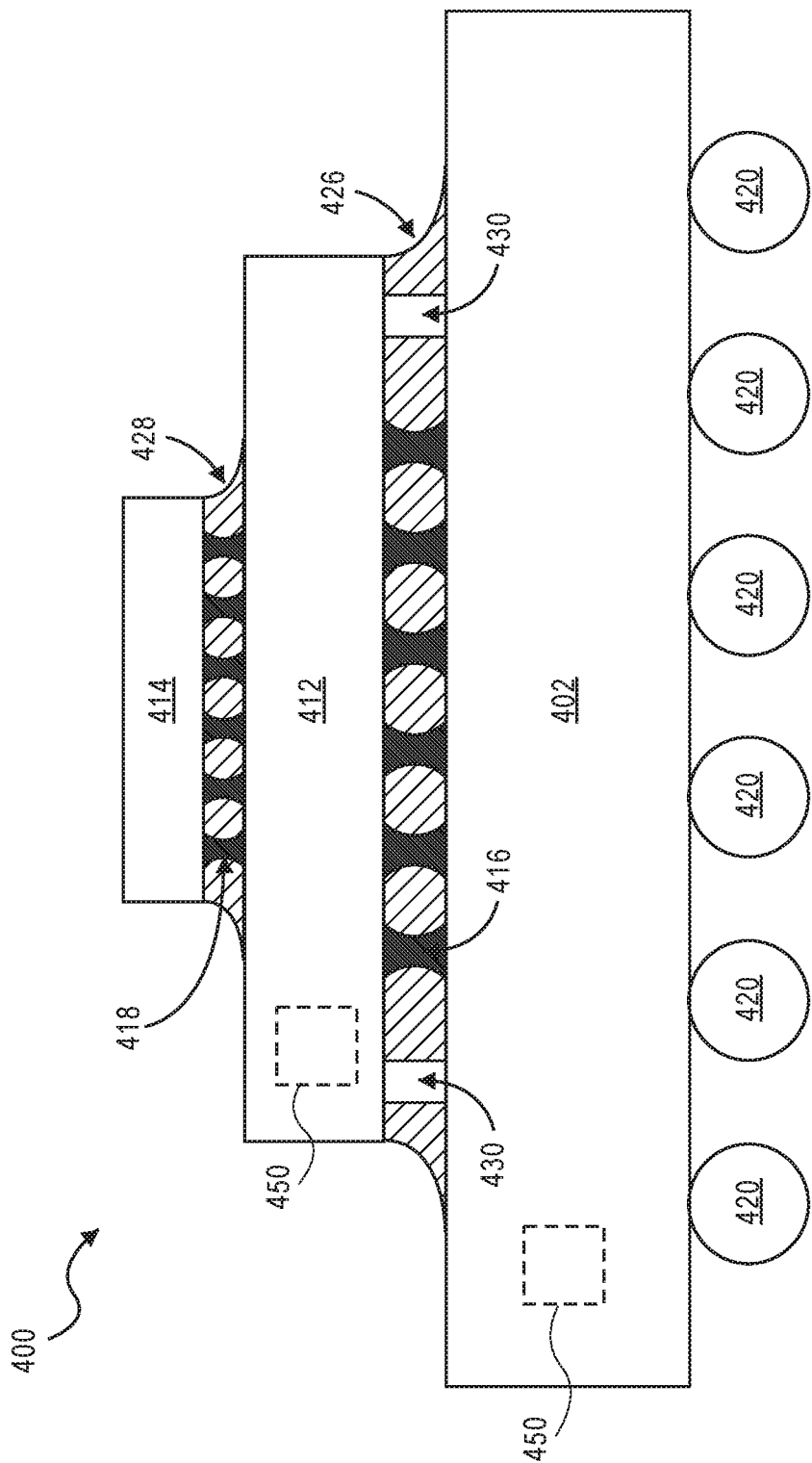
FIG. 4 is an illustration of a cross-sectional view of a semiconductor packaged system including a die, a substrate, and a package substrate, which may further include one or more SAM layers with light-reflective moieties, according to one embodiment.

FIG. 4 is a cross-sectional view of a semiconductor package 400 including a die 414, a substrate 412 (or an interposer), interconnect structures (e.g., the plurality of bumps disposed below the die 414 and the substrate 412), and a package substrate 402, where the substrate 412 and/or the package substrate 402 may include one or more SAM layers with light-reflective moieties as described herein. For some embodiments, the conductive layers 450 (or metallization structures, build-up structures/layers, etc.) disposed (or formed) on/in the substrate 412 and/or the package substrate 402 may include a SAM layer with light-reflective moieties, a via opening, one or more dielectrics, a conductive pad, and a via. For one embodiment, the conductive layers 450 of the substrate 412 and/or the package substrate 402 may be similar to the package substrate 100 of FIGS. 1A-1B, the package substrate of FIGS. 2A-2D, and the package substrate 300 of FIGS. 3A-3E. According to one embodiment, the process flow 500 may be similar to the process flow illustrated with FIGS. 3A-3E. Note that the semiconductor package 300 is not limited to the illustrated semiconductor packaged system, and thus may be designed/formed with fewer, alternate, or additional packaging components and/or with different interconnecting structures.

For one embodiment, the package substrate 402 and/or the substrate 412 of the semiconductor package 400 may include a SAM layer on one or more portions of a conductive pad, wherein the conductive pad is disposed on the package substrate 402 and/or the substrate 412, wherein the SAM layer includes a plurality of light-reflective moieties. For some embodiments, the package substrate 402 and/or the substrate 412 of the semiconductor package 400 may also include a via (e.g., a BMV) disposed on the conductive pad, and a dielectric disposed on and around the via, the SAM layer, and the conductive pad, wherein the SAM layer surrounds and contacts a surface of the via (e.g., as shown in FIG. 3E)

According to one embodiment, the semiconductor package 400 is merely one example of an embodiment of a semiconductor packaged system. For one embodiment, the semiconductor package 400 may include a land grid array (LGA) package and/or a pin grid array (PGA) package. For one embodiment, a die 414 (or an integrated circuit die) is coupled to a substrate 412 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 414, the substrate 412, and the package substrate 402 may be coupled using anisotropic conductive film (ACF). For one embodiment, the substrate 412 may be, but is not limited to, a silicon interposer and/or a die with through silicon vias (TSVs). For an alternate embodiment, the semiconductor package 400 may omit the interposer/substrate 412.

For some embodiments, the semiconductor package 400 may have the die 414 disposed on the interposer 412, where both the stacked die 414 and interposer 412 are disposed on a package substrate 402. According to some embodiments, the package substrate 402 may include, but is not limited to, a package, a substrate, a PCB, and a motherboard. For one embodiment, the package substrate 402 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 402. For one embodiment, the PCB 402 may also include conductive layers that comprise copper lines/traces, metallic pads, vias, via pads, planes, and/or holes.

For one embodiment, the die 414 may include, but is not limited to, a semiconductor die, an electronic device (e.g., a wireless device), an integrated circuit (IC), a central processing unit (CPU), a microprocessor, a platform controller hub (PCH), a memory, and a field-programmable gate array (FPGA). The die 414 may be formed from a material such as silicon and have circuitry thereon that is to be coupled to the interposer 412. Although some embodiments are not limited in this regard, the package substrate 402 may in turn be coupled to another body, for example, a computer motherboard. One or more connections between the package substrate 402, the interposer 412, and the die 414—e.g., including some or all of bumps 416, 418, and 420—may include one or more interconnect structures and underfill layers 426 and 428. In some embodiments, these interconnect structures (or connections) may variously comprise an alloy of nickel, palladium, and tin (and, in some embodiments, Cu).

Connections between the package substrate 402 and another body may be made using any suitable structure, such as the illustrative bumps 420 shown. The package substrate 402 may include a variety of electronic structures formed thereon or therein. The interposer 412 may also include electronic structures formed thereon or therein, which may be used to couple the die 414 to the package substrate 402. For one embodiment, one or more different materials may be used for forming the package substrate 402 and the interposer 412. In certain embodiments, the package substrate 402 is an organic substrate made up of one or more layers of polymer base material, with conducting regions for transmitting signals. In certain embodiments, the interposer 412 is made up of a ceramic base material including metal regions for transmitting signals. Although some embodiments are not limited in this regard, the semiconductor package 400 may include gap control structures 430—e.g., positioned between the package substrate 402 and the interposer 412. Such gap control structures 430 may mitigate a change in the height of the gap between the package substrate 402 and the interposer 412, which otherwise might occur during reflowing while die 414 is attached to interposer 412. Note that the semiconductor package 400 includes an underfill material 428 between the interposer 412 and the die 414, and an underflow material 426 between the package substrate 402 and the interposer 412. For one embodiment, the underfill materials (or layers) 426 and 428 may be one or more polymers that are injected between the layers. For other embodiments, the underfill materials may be molded underfills (MUF).

Note that the semiconductor packaged system 400 may include fewer or additional packaging components based on the desired packaging design.

Figure 5:
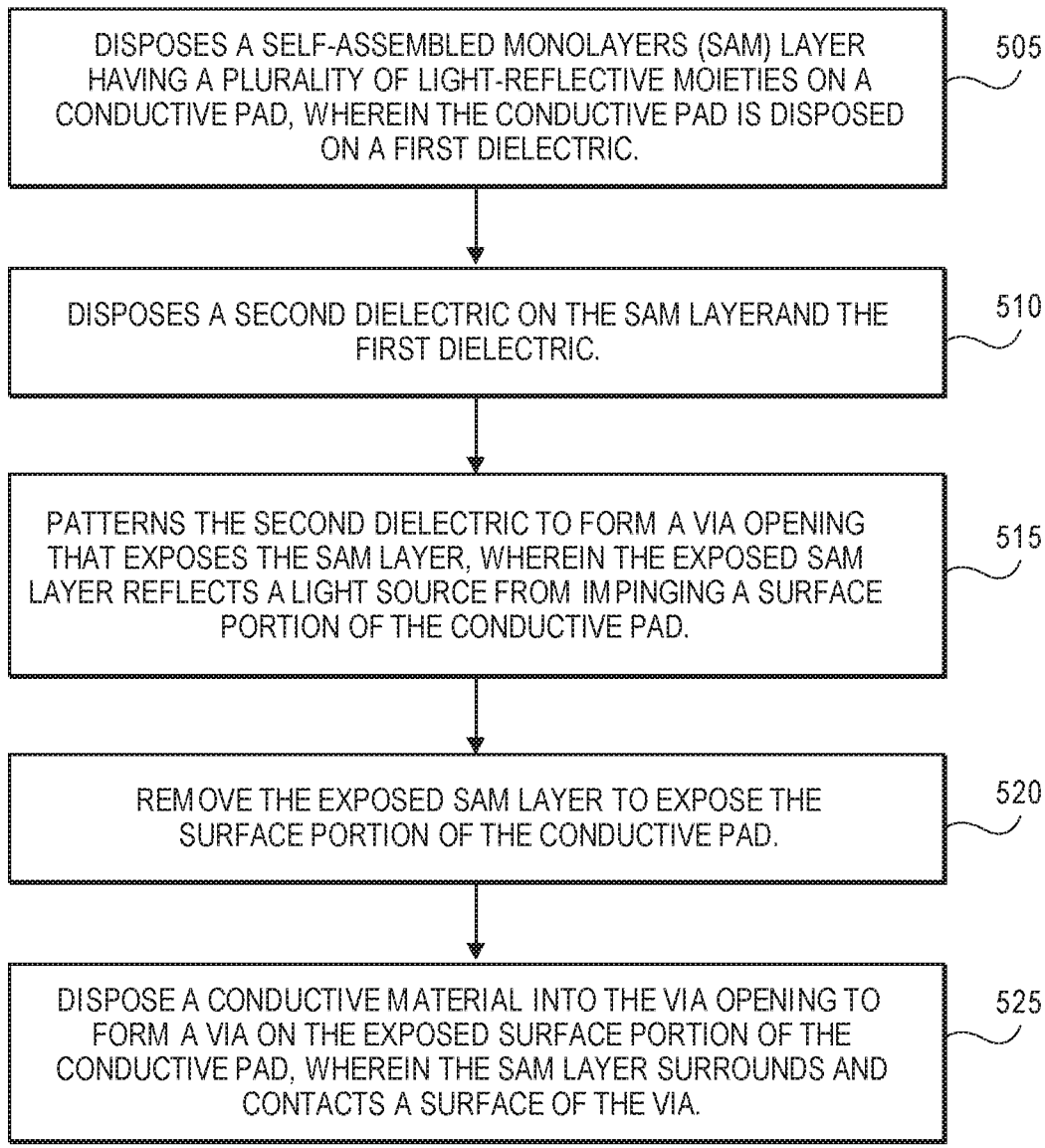
FIG. 5 is a process flow illustrating a method of forming a package substrate having a SAM layer with light-reflective moieties, a via opening, one or more dielectrics, a conductive pad, and a via, according to one embodiment.

FIG. 5 is a process flow 500 illustrating a method of forming a package substrate having a SAM layer with light-reflective moieties, a via opening, one or more dielectrics, a conductive pad, and a via, according to one embodiment. For one embodiment, the process flow 500 includes one or more steps used to form a package substrate having a SAM layer with light-reflective moieties as described herein (e.g., the package substrate 100 of FIGS. 1A-1B, the package substrate of FIGS. 2A-2D, and the package substrate 300 of FIGS. 3A-3E). According to one embodiment, the process flow 500 may be similar to the process flow illustrated with FIGS. 3A-3E. Specifically, in some embodiments, the process flow 500 may be used to create a package substrate (e.g., the package substrate 300 of FIG. 3E) having a SAM layer with light-reflective moieties and reduced/finer BMVs (e.g., the via 361 of FIG. 3E) to meet the demand driving the electronic packaging roadmap to deliver an continually decreasing FLS requirements from the existing 9/12 μm towards 2/2 μm or less, while also enabling the reduced/finer BMVs (and their respective conductive pads (e.g., the conductive pad 320 of FIG. 3E)) to be protected from any impinging light source (e.g., an UV/excimer laser) by the SAM layer with light-reflecting moieties reflecting back the excess light source energy and wavelengths.

At block 505, the process flow 500 disposes a SAM layer on a conductive pad, wherein the conductive pad is disposed on a first dielectric, and wherein the SAM layer includes a plurality of light-reflective moieties (e.g., as shown in FIG. 3A). At block 510, the process flow 500 disposes a second dielectric on the SAM layer and the first dielectric (e.g., as shown in FIG. 3B). At block 515, the process flow 500 patterns, by a light source (e.g., an UV/excimer laser or the like), the second dielectric to form a via opening that exposes the SAM layer, wherein the exposed SAM layer reflects the light source from impinging a surface portion of the conductive pad (e.g., as shown in FIG. 3C). At block 520, the process flow 500 removes the exposed SAM layer (at the bottom of the via opening) to expose the surface portion of the conductive pad (e.g., as shown in FIG. 3D). At block 525, the process flow 500 disposes a conductive material into the via opening to form a via on the exposed surface portion of the conductive pad, wherein the SAM layer surrounds and contacts a surface of the via (e.g., as shown in FIG. 3E).

Note that the package substrate formed by the process flow 500 may include fewer or additional packaging components based on the desired packaging design.

Figure 6:
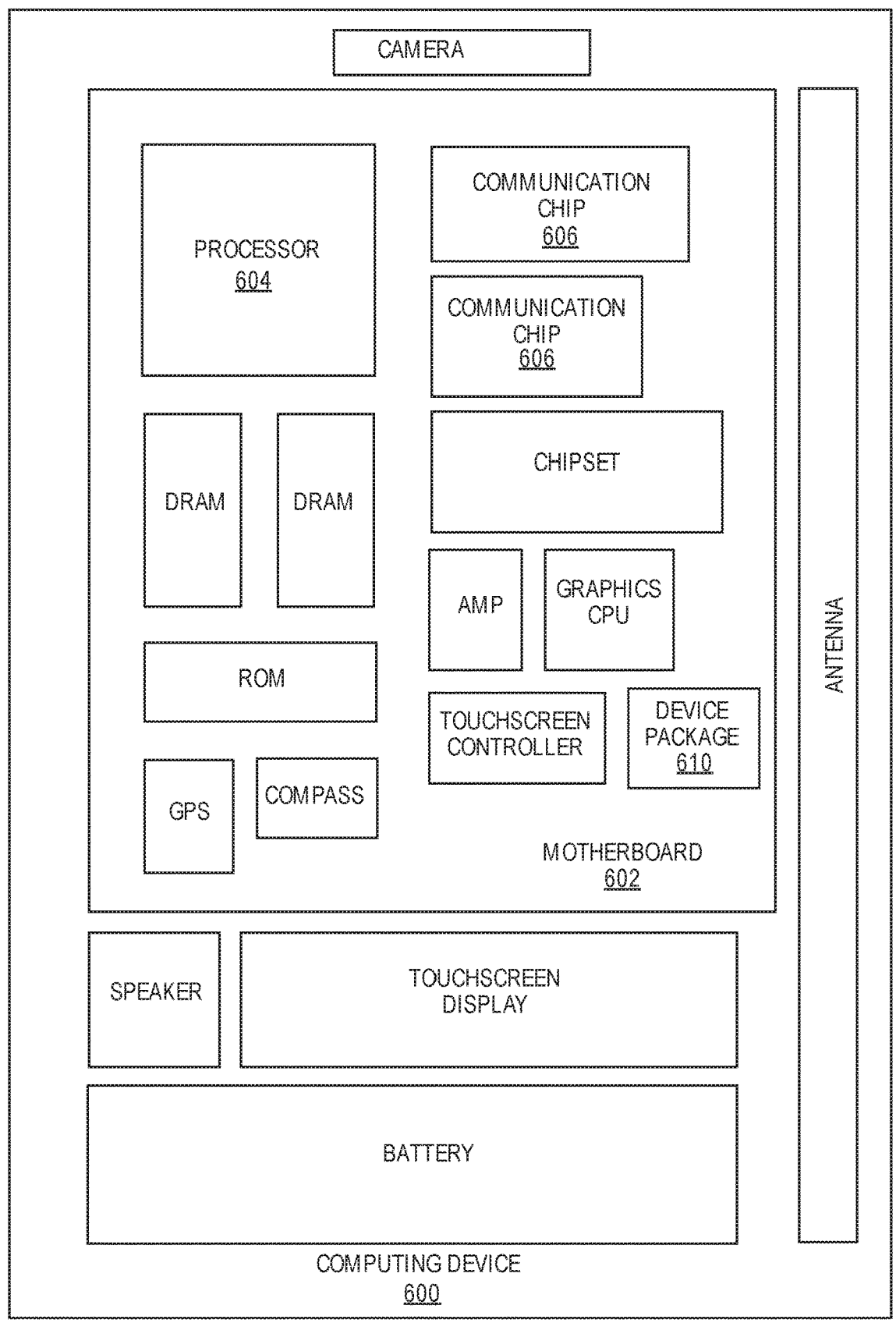
FIG. 6 is a schematic block diagram illustrating a computer system that utilizes a package substrate having a SAM layer with light-reflective moieties, a via opening, one or more dielectrics, a conductive pad, and a via, according to one embodiment.

FIG. 6 is a schematic block diagram illustrating a computer system that utilizes a package substrate having a SAM layer with light-reflective moieties, a via opening, one or more dielectrics, a conductive pad, and a via, according to one embodiment. FIG. 6 illustrates an example of computing device 600. Computing device 600 houses motherboard 602. For one embodiment, motherboard 602 may be similar to the package substrates of FIGS. 1-4. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be, but is not limited to, a substrate, a package substrate, and/or a PCB. Device package 610 may include a package substrate (as illustrated in FIGS. 1-4) having a SAM layer with light-reflective moieties, a via opening, one or more dielectrics, a conductive pad, and a via—or any other components from the figures described herein. Further, as described herein, the device package 610 may include a package substrate having a SAM layer with light-reflective moieties and reduced/finer BMVs (e.g., the via 361 of FIG. 3E) to meet the demand driving the electronic packaging roadmap to deliver an continually decreasing FLS requirements from the existing 9/12 μm towards 2/2 μm or less, while also enabling the reduced/finer BMVs (and their respective conductive pads (e.g., the conductive pad 320 of FIG. 3E)) to be protected from any impinging light source (e.g., an UV/excimer laser) by the SAM layer with light-reflecting moieties reflecting back the excess light source energy and wavelengths.

Note that device package 610 may be a single component/device, a subset of components, and/or an entire system, as the materials, features, and components may be limited to device package 610 and/or any other component of the computing device 600 that may need a SAM layer with light-reflecting moieties as described herein (e.g., the motherboard 602, the processor 604, and/or any other component of the computing device 600 that may need the SAM layer with light-reflecting moieties).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a package substrate comprising of a self-assembled monolayers (SAM) layer on one or more portions of a conductive pad. The SAM layer includes a plurality of light-reflective moieties; a via on the conductive pad; and a dielectric on and around the via, the SAM layer, and the conductive pad. The SAM layer surrounds and contacts a surface of the via.

In example 2, the subject matter of example 1 can optionally include the SAM layer which includes an interfacial organic layer.

In example 3, the subject matter of any of examples 1-2 can optionally include the via contacts a surface portion of the conductive pad.

In example 4, the subject matter of any of examples 1-3 can optionally include the via has a tapered shape.

In example 5, the subject matter of any of examples 1-4 can optionally include the SAM layer which includes a surface edge that surrounds and contacts the surface of the via. The surface edge has a tapered shape.

In example 6, the subject matter of any of examples 1-5 can optionally include each of the plurality of light-reflective moieties which includes at least one of a hemicyanine, a cyclic-hemicyanine, an oligothiophene, and a conjugated aromatic compound.

In example 7, the subject matter of any of examples 1-6 can optionally include the SAM layer which includes an adhesion promoter self-assembled monolayers (AP-SAM) layer.

In example 8, the subject matter of any of examples 1-7 can optionally include the SAM layer which includes a first monolayer and a second monolayer. The first monolayer includes a first end group and at least one of a second end group and a third end group. The second monolayer includes a fourth end group and a fifth end group. The first monolayer and the second monolayer include at least one of the plurality of light-reflective moieties and a second plurality of light-reflective moieties.

In example 9, the subject matter of any of examples 1-8 can optionally include the first end group of the first monolayer attaches to a surface of the conductive pad. The fifth end group of the second monolayer attaches to a surface of the dielectric.

Example 10 is a method of forming a package substrate, comprising of disposing a SAM layer on a conductive pad. The conductive pad is disposed on a first dielectric. The SAM layer includes a plurality of light-reflective moieties; disposing a second dielectric on the SAM layer and the first dielectric; patterning, by a light source, the second dielectric to form a via opening that exposes the SAM layer. The exposed SAM layer reflects the light source from impinging a surface portion of the conductive pad; removing the exposed SAM layer to expose the surface portion of the conductive pad; and disposing a conductive material into the via opening to form a via on the exposed surface portion of the conductive pad. The SAM layer surrounds and contacts a surface of the via.

In example 11, the subject matter of example 10 can optionally include the SAM layer includes an interfacial organic layer.

In example 12, the subject matter of any of examples 10-11 can optionally include the via contacts a surface portion of the conductive pad.

In example 13, the subject matter of any of examples 10-12 can optionally include the via having a tapered shape.

In example 14, the subject matter of any of examples 10-13 can optionally include the SAM layer which includes a surface edge that surrounds and contacts the surface of the via. The surface edge has a tapered shape.

In example 15, the subject matter of any of examples 10-14 can optionally include each of the plurality of light-reflective moieties includes at least one of a hemicyanine, a cyclic-hemicyanine, an oligothiophene, and a conjugated aromatic compound.

In example 16, the subject matter of any of examples 10-15 can optionally include the SAM layer further comprising of disposing a first monolayer on a surface of the conductive pad. The first monolayer includes a first end group and at least one of a second end group and a third end group. The first end group of the first monolayer attaches to the surface of the conductive pad; disposing a second monolayer on the first monolayer. The second monolayer includes a fourth end group and a fifth end group. The first monolayer and the second monolayer include at least one of the plurality of light-reflective moieties and a second plurality of light-reflective moieties; and bonding the fourth end group of the second monolayer and at least one of the second end group and the third end group of the first monolayer to form the SAM layer. The SAM layer includes the first end group, an intermediate group, the fifth end group, and at least one of the plurality of light-reflective moieties and the second plurality of light-reflective moieties. The intermediate group includes at least one of a first reactive bond of the second end group and the fourth end group and a second reactive bond of the third end group and the fourth end group. The fifth end group of the second monolayer attaches to a surface of the dielectric.

Example 17 is an organic layer comprising of a first monolayer having a first end group and at least one of a second end group and a third end group; a second monolayer having a fourth end group and a fifth end group. The first monolayer and the second monolayer include at least one of a first plurality of light-reflective moieties and a second plurality of light-reflective moieties; and an intermediate group bonding the fourth end group of the second monolayer and at least one of the second end group and the third end group of the first monolayer to form a SAM layer. The intermediate group includes at least one of a first reactive bond of the second end group and the fourth end group and a second reactive bond of the third end group and the fourth end group.

In example 18, the subject matter of example 17 can optionally include the SAM layer which includes a molecular structure having the first end group, the intermediate group, the fifth end group, and at least one of the first plurality of light-reflective moieties and the second plurality of light-reflective moieties.

In example 19, the subject matter of any of examples 17-18 can optionally include the SAM layer which includes an interfacial organic layer having a first surface and a second surface. The first surface attaches to a first surface portion. The second surface attaches to a second surface portion. The interfacial organic layer reflects a light source from impinging at least one of the first surface portion and the second surface portion.

In example 20, the subject matter of any of examples 17-19 can optionally include an interposer on a package substrate; and a die on the interposer. The package substrate includes the SAM layer on one or more portions of a conductive pad; a via on the conductive pad; and a dielectric on and around the via, the SAM layer, and the conductive pad. The SAM layer surrounds and contacts a surface of the via.

In example 21, the subject matter of any of examples 17-20 can optionally include the via contacts a surface portion of the conductive pad.

In example 22, the subject matter of any of examples 17-21 can optionally include the via has a tapered shape.

In example 23, the subject matter of any of examples 17-22 can optionally include the SAM layer which includes a surface edge that surrounds and contacts the surface of the via, and wherein the surface edge has a tapered shape.

In example 24, the subject matter of any of examples 17-23 can optionally include each of the first and second plurality of light-reflective moieties includes at least one of a hemicyanine, a cyclic-hemicyanine, an oligothiophene, and a conjugated aromatic compound.

In example 25, the subject matter of any of examples 17-24 can optionally include the die which includes at least one of a semiconductor die, an integrated circuit (IC), a central processing unit (CPU), a microprocessor, a platform controller hub (PCH), a memory, and a field-programmable gate array (FPGA).

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
    a self-assembled monolayers (SAM) layer on one or more portions of a conductive pad, wherein the SAM layer includes a plurality of light-reflective moieties;
    a via on the conductive pad; and
    a dielectric on and around the via, the SAM layer, and the conductive pad, wherein the SAM layer surrounds and contacts a surface of the via.

2. The package substrate of claim 1, wherein the SAM layer includes an interfacial organic layer.

3. The package substrate of claim 1, wherein the via contacts a surface portion of the conductive pad.

4. The package substrate of claim 1, wherein the via has a tapered shape.

5. The package substrate of claim 1, wherein the SAM layer includes a surface edge that surrounds and contacts the surface of the via, and wherein the surface edge has a tapered shape.

6. The package substrate of claim 1, wherein each of the plurality of light-reflective moieties includes at least one of a hemicyanine, a cyclic-hemicyanine, an oligothiophene, and a conjugated aromatic compound.

7. The package substrate of claim 1, wherein the SAM layer includes an adhesion promoter self-assembled monolayers (AP-SAM) layer.

8. The package substrate of claim 1, wherein the SAM layer includes a first monolayer and a second monolayer, wherein the first monolayer includes a first end group and at least one of a second end group and a third end group, wherein the second monolayer includes a fourth end group and a fifth end group, and wherein the first monolayer and the second monolayer include at least one of the plurality of light-reflective moieties and a second plurality of light-reflective moieties.

9. The package substrate of claim 8, wherein the first end group of the first monolayer attaches to a surface of the conductive pad, and wherein the fifth end group of the second monolayer attaches to a surface of the dielectric.

10. A method of forming a package substrate, comprising:
    disposing a SAM layer on a conductive pad, wherein the conductive pad is disposed on a first dielectric, and wherein the SAM layer includes a plurality of light-reflective moieties;
    disposing a second dielectric on the SAM layer and the first dielectric;
    patterning, by a light source, the second dielectric to form a via opening that exposes the SAM layer, wherein the exposed SAM layer reflects the light source from impinging a surface portion of the conductive pad;
    removing the exposed SAM layer to expose the surface portion of the conductive pad; and
    disposing a conductive material into the via opening to form a via on the exposed surface portion of the conductive pad, wherein the SAM layer surrounds and contacts a surface of the via.

11. The method of claim 10, wherein the SAM layer includes an interfacial organic layer.

12. The method of claim 10, wherein the via contacts a surface portion of the conductive pad.

13. The method of claim 10, wherein the via has a tapered shape.

14. The method of claim 10, wherein the SAM layer includes a surface edge that surrounds and contacts the surface of the via, and wherein the surface edge has a tapered shape.

15. The method of claim 10, wherein each of the plurality of light-reflective moieties includes at least one of a hemicyanine, a cyclic-hemicyanine, an oligothiophene, and a conjugated aromatic compound.

16. The method of claim 10, wherein the SAM layer further comprises:
   disposing a first monolayer on a surface of the conductive pad, wherein the first monolayer includes a first end group and at least one of a second end group and a third end group, and wherein the first end group of the first monolayer attaches to the surface of the conductive pad;
   disposing a second monolayer on the first monolayer, wherein the second monolayer includes a fourth end group and a fifth end group, wherein the first monolayer and the second monolayer include at least one of the plurality of light-reflective moieties and a second plurality of light-reflective moieties; and
   bonding the fourth end group of the second monolayer and at least one of the second end group and the third end group of the first monolayer to form the SAM layer, wherein the SAM layer includes the first end group, an intermediate group, the fifth end group, and at least one of the plurality of light-reflective moieties and the second plurality of light-reflective moieties, wherein the intermediate group includes at least one of a first reactive bond of the second end group and the fourth end group and a second reactive bond of the third end group and the fourth end group, and wherein the fifth end group of the second monolayer attaches to a surface of the dielectric.

17. An organic layer, comprising:
   a first monolayer having a first end group and at least one of a second end group and a third end group;
   a second monolayer having a fourth end group and a fifth end group, wherein the first monolayer and the second monolayer include at least one of a first plurality of light-reflective moieties and a second plurality of light-reflective moieties; and
   an intermediate group bonding the fourth end group of the second monolayer and at least one of the second end group and the third end group of the first monolayer to form a SAM layer, wherein the intermediate group includes at least one of a first reactive bond of the second end group and the fourth end group and a second reactive bond of the third end group and the fourth end group.

18. The organic layer of claim 17, wherein the SAM layer includes a molecular structure having the first end group, the intermediate group, the fifth end group, and at least one of the first plurality of light-reflective moieties and the second plurality of light-reflective moieties.

19. The organic layer of claim 17, wherein the SAM layer includes an interfacial organic layer having a first surface and a second surface, wherein the first surface attaches to a first surface portion, wherein the second surface attaches to a second surface portion, and wherein the interfacial organic layer reflects a light source from impinging at least one of the first surface portion and the second surface portion.

20. The organic layer of claim 17, further comprising:
   an interposer on a package substrate; and
   a die on the interposer, wherein the package substrate includes
      the SAM layer on one or more portions of a conductive pad;
      a via on the conductive pad; and
      a dielectric on and around the via, the SAM layer, and the conductive pad, wherein the SAM layer surrounds and contacts a surface of the via.

21. The organic layer of claim 20, wherein the via contacts a surface portion of the conductive pad.

22. The organic layer of claim 20, wherein the via has a tapered shape.

23. The organic layer of claim 20, wherein the SAM layer includes a surface edge that surrounds and contacts the surface of the via, and wherein the surface edge has a tapered shape.

24. The organic layer of claim 17, wherein each of the first and second plurality of light-reflective moieties includes at least one of a hemicyanine, a cyclic-hemicyanine, an oligothiophene, and a conjugated aromatic compound.

25. The organic layer of claim 20, wherein the die includes at least one of a semiconductor die, an integrated circuit (IC), a central processing unit (CPU), a microprocessor, a platform controller hub (PCH), a memory, and a field-programmable gate array (FPGA).

* * * * *